United States Patent
Cho et al.

(10) Patent No.: US 7,732,297 B2
(45) Date of Patent: Jun. 8, 2010

(54) METHOD OF MANUFACTURING AN INSULATING LAYER AND METHOD OF MANUFACTURING A SEMICONDUCTOR DEVICE USING THE INSULATING LAYER

(75) Inventors: Jun-Hyun Cho, Gyeonggi-do (KR); Mi-Ae Kim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 673 days.

(21) Appl. No.: 11/463,287

(22) Filed: Aug. 8, 2006

(65) Prior Publication Data
US 2007/0045852 A1    Mar. 1, 2007

(30) Foreign Application Priority Data
Aug. 8, 2005    (KR) .................... 10-2005-0072119

(51) Int. Cl.
*H01L 21/3205* (2006.01)
*H01L 21/76* (2006.01)
(52) U.S. Cl. .................... 438/408; 438/216; 438/591
(58) Field of Classification Search ................ None
See application file for complete search history.

(56) References Cited

U.S. PATENT DOCUMENTS 4,914,497 A * 4/1990 Kondo ................ 257/296
5,530,293 A * 6/1996 Cohen et al. ............... 257/752
6,875,678 B2 * 4/2005 Jung et al. .................. 438/591
2006/0102977 A1 * 5/2006 Fucsko et al. ............... 257/499

FOREIGN PATENT DOCUMENTS

| JP | 7-14917 | 1/1995 |
| KR | 10-2001-0027003 | 4/2001 |
| KR | 2002-0073261 | 9/2002 |
| KR | 2003-0049567 | 6/2003 |

OTHER PUBLICATIONS

English language abstract of Japanese Publication No. 7-14917.
English language abstract of Korean Publication No. 10-2001-0027003.
English language abstract of Korean Publication No. 2003-0049567.

* cited by examiner

*Primary Examiner*—Zandra Smith
*Assistant Examiner*—Pamela E Perkins
(74) *Attorney, Agent, or Firm*—Harness, Dickey & Pierce, PLC

(57) ABSTRACT

A method of forming an insulating layer and a method of manufacturing a semiconductor device using insulating layer are disclosed. A preliminary insulating layer including a material having a relatively low dielectric constant is formed on an object. An upper portion of the preliminary insulating layer is provided with an ozone gas to transform the preliminary insulating layer into an insulating layer having an upper insulating film including an oxide and a lower insulating film including the material having the relatively low dielectric constant. The upper insulating film may further be located on the lower insulating film.

18 Claims, 16 Drawing Sheets

US 7,732,297 B2

METHOD OF MANUFACTURING AN INSULATING LAYER AND METHOD OF MANUFACTURING A SEMICONDUCTOR DEVICE USING THE INSULATING LAYER

CROSS REFERENCE TO RELATED APPLICATION

This application claims benefit of priority under 35 U.S.C. §119 from Korean Patent Application No. 10-2005-0072119 filed on Aug. 8, 2005, in the Korean Intellectual Property Office, the disclosure of which is incorporated herein by reference in its entirety.

BACKGROUND

1. Field of the Invention

The present invention relates to a method of forming an insulating layer and a method of manufacturing a semiconductor device using the insulating layer. More particularly, the present invention relates to a method of forming an insulating layer between conductors for insulating the conductors from each other and a method of manufacturing a semiconductor device by using the insulating layer.

2. Description of the Related Art

In general, when a material having a relatively high dielectric constant is formed between conductive structures to electrically insulate the conductive structures from each other, a parasitic capacitance is generated. To help prevent a parasitic capacitance from being generated, an insulating layer including a material having a relatively low dielectric constant may be formed between the conductive structures and on the conductive structures to electrically insulate the conductive structures from each other. Particularly, the insulating layer includes an upper portion and a lower portion. The upper portion covers the upper faces of the conductive structures, and the lower portion is located below the upper portion.

The material having the relatively low dielectric constant may be hydrogen silsesquioxane (HSQ), methyl silsesquioxane (MSQ), or methyl hydrogen silsesquioxane (MHSQ).

However, hydrogen silsesquioxane is easily damaged by a stripping process using an amine solution, methyl silsesquioxane is easily damaged by an ashing process using an oxygen gas, and methyl hydrogen silsesquioxane is easily damaged by the stripping process using the amine solution as well as the ashing process using oxygen ($O_2$).

Thus, when a contact plug is formed through the upper portion of an insulating layer to be electrically connected to the upper face of a conductive structure, a bowing may be generated.

In order to reduce the bowing, methods of forming a dual insulating layer having an upper insulating film including oxide and a lower insulating film including a material having the relatively low dielectric constant are suggested. The dual insulating film may be formed by providing an upper portion of the insulating layer with an oxygen ($O_2$) gas or an oxygen plasma. Here, the upper portion and the lower portion of the insulating layer may correspond to the upper insulating film and the lower insulating film, respectively.

In this case, when the upper insulating film is exceedingly thick, the upper insulating film may have a relatively large dielectric constant as compared to the lower insulating film. Thus, an overall dielectric constant of the dual insulating layer may increase.

In addition, when the upper insulating film is exceedingly thick, the dual insulating layer may be excessively shrunk because oxide in the upper insulating film is formed by dehydration/condensation reactions. Furthermore, as the upper insulating film gets excessively thick, the amount of byproducts and moisture that are generated in the upper insulating film while the oxide is formed may increase. This occurs because the amount of byproducts and moisture is substantially proportional to a thickness of the upper insulating film.

Additionally, because the thickness of the upper insulating film is relatively large, the large amount of the byproducts and the moisture may not be easily removed through the upper insulating film even though a thermal treatment is performed on the upper insulating film. Thus, it is desirable to control the thickness of the upper insulating film to prevent the problems associated with an excessively thick upper insulating layer.

However, because the oxygen gas and the oxygen plasma can quickly form an excessively thick upper insulating layer, it can be hard to efficiently control the thickness of the upper insulation film.

SUMMARY

Some embodiments of the present invention provide methods of manufacturing an insulating layer having an upper portion including oxide where the methods are capable of efficiently controlling the thickness of the upper potion, while other embodiments of the present invention provide methods of manufacturing a semiconductor device using the insulating layer.

In accordance with some embodiments of the present invention, there is provided a method of forming an insulating layer. In the method, a preliminary insulating layer including a material having a relatively low dielectric constant is formed on an object. An upper portion of the preliminary insulating layer is provided with an ozone gas to transform the preliminary insulating layer into an insulating layer having an upper insulating film including an oxide and a lower insulating film including the material having the relatively low dielectric constant. The upper insulating film may further be located on the lower insulating film.

In accordance with some embodiments of the present invention, there is provided a method of manufacturing a semiconductor device. In the method, a conductive pattern is formed on a first insulating layer. The conductive pattern has an opening partially exposing the first insulating layer. A preliminary second insulating layer is formed on the first insulating layer and the conductive pattern. The preliminary second insulating layer fills up the opening. The preliminary second insulating layer includes a material having a relatively low dielectric constant. An upper portion of the preliminary second insulating layer is provided with an ozone gas to transform the preliminary second insulating layer into a second insulating layer comprising an upper insulating film including an oxide and a lower insulating film including the material having the relatively low dielectric constant. The upper insulating film covers an upper face of the conductive pattern. The lower insulating film is formed under the upper insulating film. A third insulating layer is formed on the upper insulating film. A conductive plug is formed through the third insulating layer and the upper insulating film to be electrically connected to the conductive pattern. A conductive layer is formed on the conductive plug and the third insulating layer.

In accordance with some embodiments of the present invention, there is provided a method of manufacturing a semiconductor device. In the method, a preliminary spin-on layer is formed on an object. The preliminary spin-on layer includes a material having a relatively low dielectric constant and a porogen. A first thermal treatment is performed on the preliminary spin-on layer to form a spin-on layer including a plurality of pores. An ozone treatment is performed on the spin-on layer to form a preliminary insulating layer comprising a preliminary upper insulating film including an oxide and a preliminary lower insulating film including the material having the relatively low dielectric constant. The pores in the preliminary upper insulating film are removed, A second thermal treatment is performed on the preliminary insulating layer to form an insulating layer comprising an upper insulting film and a lower insulating film. The second thermal treatment removes byproducts and moisture from the upper preliminary insulating layer.

According to the present invention, when an insulating layer including an upper portion of oxide and a lower portion of a low-k material is formed, a thickness of the upper portion may be efficiently controlled.

BRIEF DESCRIPTION OF THE DRAWINGS

The above and other advantages of the present invention will become readily apparent by reference to the following detailed description when considered in conjunction with the accompanying drawings in which.

DETAILED DESCRIPTION

Figure 1:
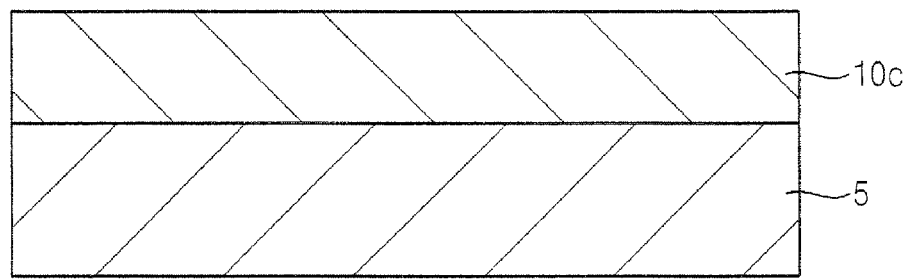
FIGS. 1 to 4 are cross-sectional views illustrating methods of manufacturing an insulating layer in accordance with an embodiment of the present invention.

Embodiments of the present invention will be described with reference to the accompanying drawings. The present invention may, however, be embodied in many different forms and should not be construed as limited to the embodiments set forth herein. Rather, the embodiments are provided so that disclosure of the present invention will be thorough and complete, and will fully convey the scope of the present invention to those skilled in the art. The principles and features of this invention may be employed in varied and numerous embodiments without departing from the scope of the present invention. In the drawings, the size and relative sizes of layers and regions may be exaggerated for clarity. The drawings may further not be to scale. Like reference numerals refer to like elements throughout.

It will be understood that when an element or layer is referred to as being "on," "connected to," and/or "coupled to" another element or layer, the element or layer may be directly on, connected, and/or coupled to the other element or layer or intervening elements or layers may be present. In contrast, when an element is referred to as being "directly on," "directly connected to," and/or "directly coupled to" another element or layer, there may be no intervening elements or layers present. As used herein, the term "and/or" may include any and all combinations of one or more of the associated listed items.

It will be understood that, although the terms first, second, etc. may be used herein to describe various elements, components, regions, layers, and/or sections, these elements, components, regions, layers, and/or sections should not be limited by these terms. These terms may be used to distinguish one element, component, region, layer, and/or section from another element, component, region, layer, and/or section. For example, a first element, component, region, layer, and/or section discussed below could be termed a second element, component, region, layer, and/or section without departing from the teachings of the present invention.

Spatially relative terms, such as "beneath," "below," "lower," "above," "upper," and the like may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, if the device in the figures is turned over, elements described as "below" and/or "beneath" other elements or features would then be oriented "above" the other elements or features. The device may be otherwise oriented (e.g., rotated 90 degrees or at other orientations) and the spatially relative descriptors used herein should be interpreted accordingly.

The terminology used herein is for the purpose of describing particular embodiments only and is not intended to limit the invention. As used herein, the singular terms "a," "an," and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence and/or addition of one or more other features, integers, steps, operations, elements, components, and/or groups thereof.

Unless otherwise defined, all terms (including technical and scientific terms) used herein may have the same meaning as what is commonly understood by one of ordinary skill in the art. It will be further understood that terms, such as those defined in commonly used dictionaries, should be interpreted as having a meaning that is consistent with their meaning in the context of the relevant art and will not be interpreted in an idealized and/or overly formal sense unless expressly so defined herein.

Embodiments of the present invention are described with reference to cross-sectional illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an etched region illustrated as a rectangle will, typically, have rounded or curved features. Thus, the regions illustrated in the figures are schematic in nature of a device and are not intended to limit the scope of the present invention.

FIGS. 1 to 4 are cross-sectional views illustrating methods of manufacturing an insulating layer in accordance with an embodiment of the present invention.

Referring to FIG. 1, a preliminary spin-on layer 10c is formed on an object 5 by using a solvent and a material having a relatively low dielectric constant. The material having the relatively low dielectric constant is hereinafter referred to as a low-k material. The low-k material is meant a material having a dielectric constant lower than that of silicon oxide. A dielectric constant of silicon oxide is about 3.9. The object 5 may include a metal member (not shown) including a metal such as aluminum (Al), tungsten (W), titanium (Ti), copper (Cu), etc.

The low-k material may include silicon. For example, the low-k material may be hydrogen silsesquioxane (HSQ), methyl silsesquioxane (MSQ), or methyl hydrogen silsesquioxane (MHSQ). These materials may be used alone or in a mixture thereof.

Particularly, hydrogen silsesquioxane includes silicon combined with hydrogen (H). Methyl silsesquioxane includes silicon combined with methyl group (—$CH_3$). Methyl hydrogen silsesquioxane includes silicon combined with hydrogen and silicon combined with methyl group.

The solvent may be propylene glycol dimethyl ether (PGDE). Because the preliminary spin-on layer 10c includes the solvent, the preliminary spin-on layer 10c may be fluid and have fluidity.

Figure 2:
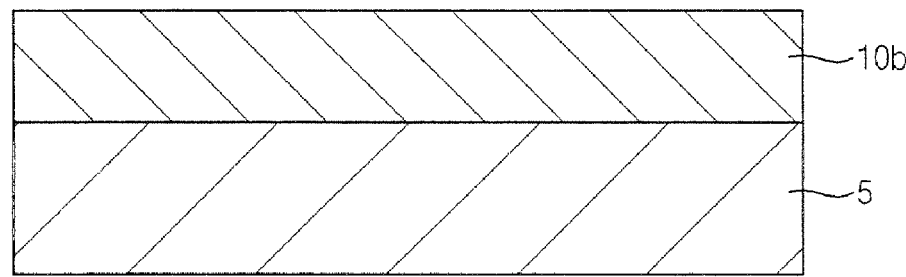

Referring to FIG. 2, a preliminary thermal treatment is performed on the preliminary spin-on layer 10c so that a spin-on layer 10b may be formed. The preliminary thermal treatment includes a preliminary first thermal treatment, a preliminary second thermal treatment, and a preliminary third thermal treatment.

The preliminary first thermal treatment may be performed at a temperature of about 70° C. to about 90° C. for about 1 minute to about 3 minutes in a nitrogen ($N_2$) atmosphere. For example, the preliminary first thermal treatment may be performed at a temperature of about 80° C. for about 2 minutes in the nitrogen atmosphere. The solvent in the preliminary spin-on layer 10c may be removed by the preliminary first thermal treatment so that the spin-on layer 10b may be relatively solid.

The preliminary second thermal treatment is performed after the preliminary first thermal treatment. The preliminary second thermal treatment may be performed at a temperature of about 90° C. to about 260° C. for about 1 minute to about 3 minutes in a nitrogen atmosphere. For example, the preliminary second thermal treatment may be performed at a temperature or about 150° C. for about 2 minutes in the nitrogen atmosphere. Surface flatness of the spin-on layer 10b may be improved by the preliminary second thermal treatment.

The preliminary third thermal treatment is performed after the preliminary second thermal treatment. The third thermal treatment may be performed at a temperature of about 260° C. to about 370° C. for about 1 minute to about 3 minutes in a nitrogen atmosphere. For example, the preliminary third treatment may be performed at a temperature of about 350° C. for about 2 minutes in the nitrogen atmosphere. The spin-on layer 10b may become denser by virtue of the preliminary third thermal treatment.

Figure 3:
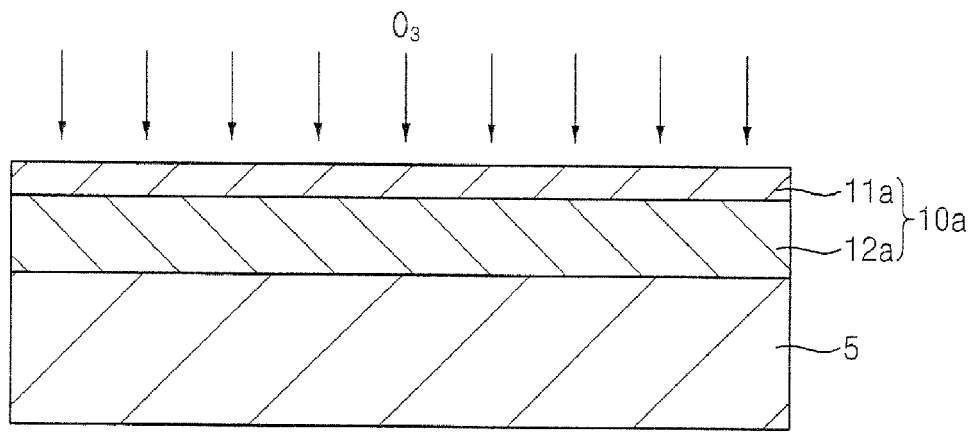

Referring to FIG. 3, an upper portion of the spin-on layer 10b is provided with an ozone ($O_3$) gas so that a preliminary insulating layer 10a including a preliminary upper insulating film 11a and a preliminary lower insulating film 12a may be formed.

Reactivity of an oxygen ($O_2$) gas having a relatively high temperature or an oxygen plasma may be greater than that of the ozone gas. Thus, if the spin-on layer 10b is provided with the oxygen gas or the oxygen plasma instead of the ozone gas to form the preliminary upper insulating film 11a, the preliminary upper insulating film 11a may become relatively thick in a relatively short time. Hence, it may be hard to control the thickness of the preliminary upper insulating film 11a. Consequently the thickness of the preliminary upper insulating film 11a may be more efficiently controlled by providing the spin-on layer with the ozone gas to form the preliminary upper insulating film 11a.

When the spin-on layer 10b is provided with the ozone gas, a hydroxyl group (—OH) may substitute for a hydrogen and/or methyl group to be combined with silicon in the low-k material to generate byproducts.

Hydroxyl groups combined with respective silicon atoms may generate silicon oxide ($SiO_2$) and moisture ($H_2O$) in a process of dehydration/condensation reactions. Thus, the preliminary upper insulating film 11a may include the byproducts, silicon oxide, and moisture. Here, when the thickness of the preliminary upper insulating film 11a increases, amounts of byproducts, silicon oxide, and moisture in the preliminary upper insulating film 11a may also increase. On the other hand, the preliminary lower insulating film 12a may still include the low-k material.

When the ozone density of the ozone gas is lower than about 100 g/$Nm^3$, the hydroxyl group may not efficiently substitute for the hydrogen and/or methyl group to be combined with the silicon included in the low-k material. On the other hand, when the ozone density of the ozone gas is higher than about 350 g/$Nm^3$, the preliminary upper insulating film 11a may be relatively thick. In addition, the preliminary upper insulating film 11a may include relatively large amounts of the byproducts and the moisture. Thus, the byproducts and the moisture may not be clearly removed even when a main thermal treatment is subsequently performed on the preliminary insulating layer 10a. Thus, the ozone density of the ozone gas may preferably be about 100 g/$Nm^3$ to about 350 g/$Nm^3$.

If the preliminary insulating layer 10a is formed at a temperature lower than about 50° C., the ozone gas may have a relatively small amount of energy. Thus, it may be disadvantageous in that hydroxyl group may not efficiently substitute for the hydrogen and/or methyl group to be combined with the silicon included in the low-k material. On the other hand, if the preliminary insulating layer 10a is formed at a temperature above about 450° C., the preliminary upper insulating film 11a may be relatively thick. In addition, the preliminary upper insulating film 11a may include a relatively large amount of the byproducts and moisture. Thus, the byproducts and the moisture may not be clearly removed even when the main thermal treatment is subsequently performed on the preliminary insulating layer 10a. Thus, the preliminary insulating layer 10a may preferably be formed at a temperature of about 50° C. to about 450° C.

If a time for forming the preliminary insulating layer 10a is shorter than about 5 seconds, the hydroxyl group may not efficiently substitute for the hydrogen and/or methyl group to be combined with silicon included in the low-k material. On the other hand, if the time for forming the preliminary insulating layer 10a is longer than about 600 seconds, the preliminary upper insulating film 11a may be relatively thick. In addition, the preliminary upper insulating film 11a may include a relatively large amount of the byproducts and moisture. Thus, the byproducts and the moisture may not be clearly removed even when the main thermal treatment is subsequently performed on the preliminary insulating layer 10a. Thus, the preliminary insulating layer 10a may preferably be formed for about 5 seconds to about 600 seconds.

Here, the preliminary upper insulating film 11a and the preliminary lower insulating film 12a may include silicon oxide and low-k material, respectively. Thus, the dielectric constant of the preliminary lower insulating film 12a may be smaller than that of the upper insulating film 11a.

In addition, the preliminary upper insulating film 11a may be formed by the dehydration/condensation reaction. Thus, the preliminary upper insulating film 11a may be denser than the preliminary lower insulating film 12a.

Figure 4:
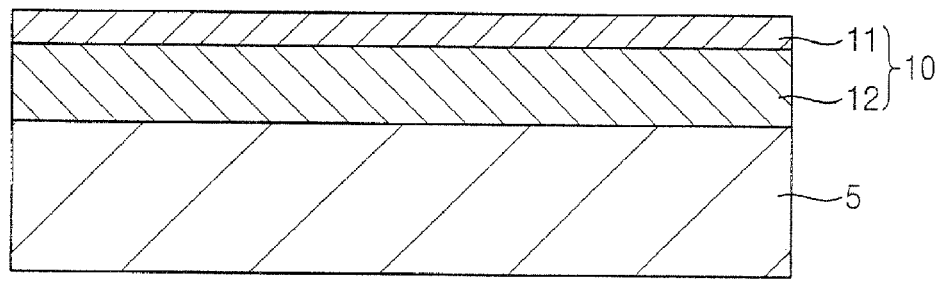

Referring to FIG. 4, the main thermal treatment is performed on the preliminary insulating layer 10a so that an insulating layer 10 including an upper insulating film 11 and a lower insulating film 12 may be formed. The main thermal treatment is performed to remove the byproducts and moisture included in the preliminary upper insulating film 11a. Thus, the upper insulating film 11 may be denser than the preliminary upper insulating film 11a.

In addition, the byproducts and moisture diffused into the preliminary lower insulating film 12a by the preliminary thermal treatment may be removed by the main thermal treatment so that the lower insulating film 12 may be denser than the preliminary lower insulating film 12a.

The preliminary thermal treatment may be performed using an inactive gas such as a nitrogen ($N_2$) gas. Alternatively, the preliminary thermal treatment may be performed using an inert gas such as an argon (Ar) gas.

If the main thermal treatment is performed at a temperature lower than about 370° C., the byproducts and the moisture may not be clearly removed from the preliminary upper insulating film 11a. On the other hand, if the main thermal treatment is performed at a temperature higher than about 440° C., a metal member in the object 5 may be melted. Thus, the main thermal treatment may preferably be performed at a temperature of about 370° C. to about 440° C.

If a time during which the main thermal treatment is shorter than about 27 minutes, the byproducts and the moisture may not be clearly removed from the preliminary upper insulating film 11a. On the other hand, if the main thermal treatment is performed for more than about 33 minutes, the metal member in the object 5 may be damaged. Thus, the main thermal treatment may preferably be performed for about 27 to about 33 minutes.

FIGS. 5 to 8 are cross-sectional views illustrating methods of manufacturing an insulating layer in accordance with another embodiment of the present invention.

The methods illustrated in FIGS. 5 to 8 are substantially the same as those already illustrated in FIGS. 1 to 4 except the preliminary spin-on layer 20c further includes a porogen. Thus, the same reference numerals will be used in FIGS. 5 to 8 to refer to the same parts as those described in FIGS. 1 to 4. In addition, any repetitive explanation will be omitted. Here, the porogen is a material utilized to form pores.

Figure 5:
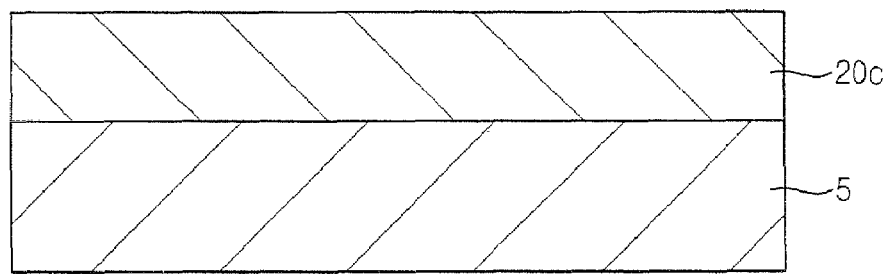
FIGS. 5 to 8 are cross-sectional views illustrating methods of manufacturing an insulating layer in accordance with another embodiment of the present invention.

Referring to FIG. 5, a preliminary spin-on layer 20c is formed on an object 5 by using a low-k material, a solvent, and a porogen. The low-k material may include silicon. The porogen may be polyethylene glycol dimethyl ether.

Figure 6:
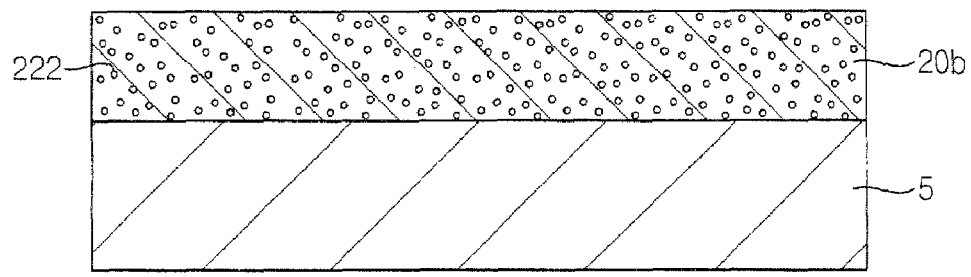

Referring to FIG. 6, a preliminary thermal treatment including a preliminary first thermal treatment, a preliminary second thermal treatment and a preliminary third thermal treatment may be performed on the preliminary spin-on layer 20c so that a spin-on layer 20b is formed.

The porogen in the preliminary spin-on layer 20c may be volatized at a relatively high temperature so that a multiplicity of pores 222 may be formed in the spin-on layer 20b. Diameters of the pores 222 may be in the tens of angstroms. The pores 222 may reduce the dielectric constant of the spin-on layer 20b.

Figure 7:
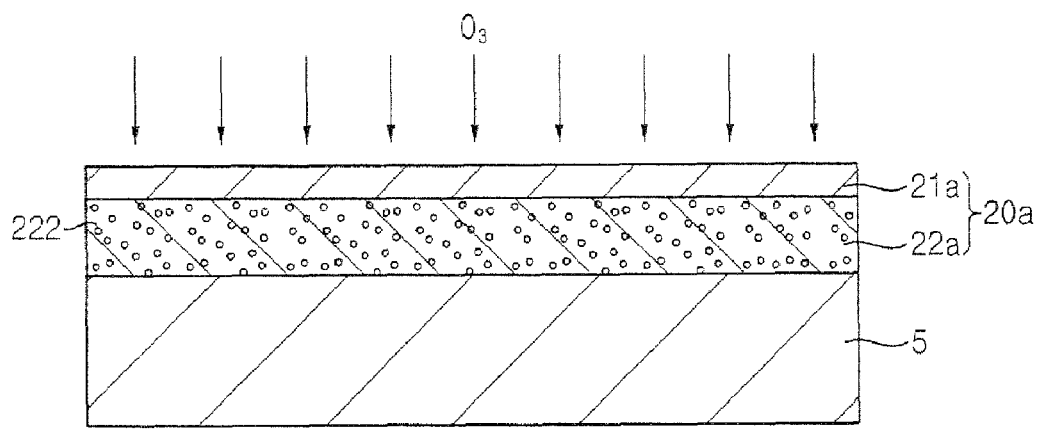

Referring to FIG. 7, an upper portion of the spin-on layer 20b is provided with an ozone gas so that a preliminary insulating layer 20a including a preliminary upper insulating film 21a and a preliminary lower insulating film 22a may be formed. Here, pores 222 in the preliminary upper insulating film 21a may be removed.

The preliminary upper insulating film 21a may include byproducts, silicon oxide, and moisture. On the other hand, the preliminary lower insulating film 22a may include the low-k material. In addition, the preliminary lower insulating film 22a may include pores 222.

Figure 8:
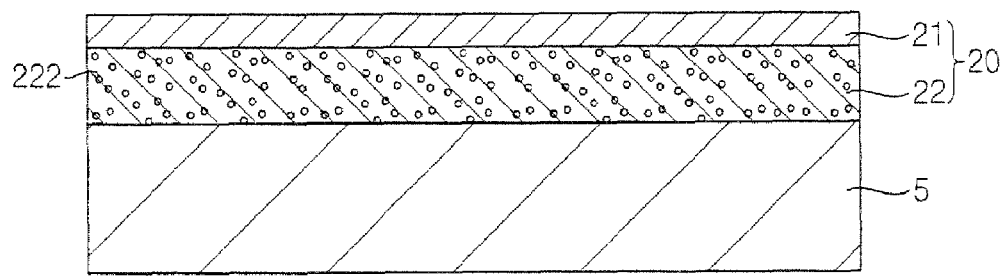

Referring to FIG. 8, a main thermal treatment is performed on a preliminary insulating layer 20a so that an insulating layer 20 including an upper insulating film 21 and a lower insulating film 22 is formed. The byproducts and the moisture in the preliminary upper insulating film 21a may be removed by the main thermal treatment. In addition, the lower insulating film 21 formed by the main thermal treatment may be denser than the preliminary lower insulating film 20a.

FIGS. 9 to 17 are cross-sectional views illustrating semiconductors in accordance with some embodiments of the present invention.

Figure 9:
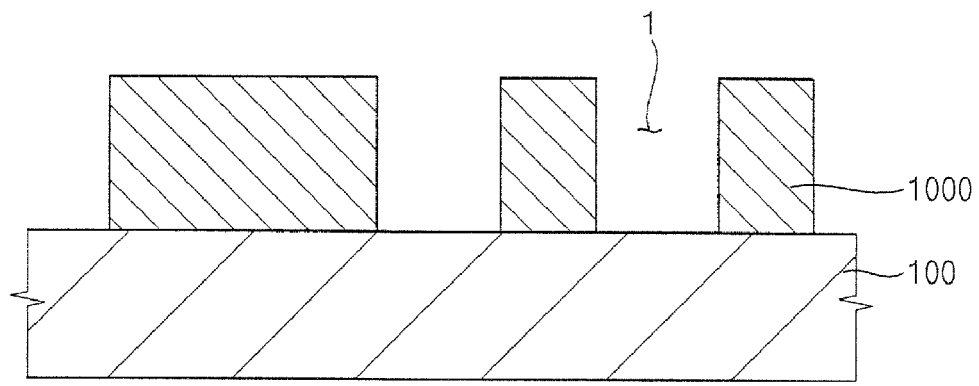
FIGS. 9 to 17 are cross-sectional views illustrating methods of manufacturing a semiconductor device in accordance with an embodiment of the present invention.

Referring to FIG. 9, a conductive pattern 1000 having at least one first opening 1 partially exposing a first insulating layer 100 is formed on the first insulating layer 100. The first insulating layer 100 is formed using an insulating material such as silicon oxide by a chemical vapor deposition (CVD) process.

The conductive pattern 1000 may be formed using a conductive material such as a metal by a physical vapor deposition (PVD) process. The metal may be, for example, aluminum, tungsten, titanium, and copper.

Although it is not particularly illustrated in FIG. 9, a portion of the first insulating layer 100, the portion being exposed through the first opening 1, may be intentionally removed so that a depth of the first opening 1 is increased.

In addition, although it is not particularly illustrated in FIG. 9, a capping layer may be formed on the conductive pattern 1000. The capping layer may include a metal such as titanium. Alternatively, the capping layer may include a metal nitride having conductivity. The metal nitride may be titanium nitride.

Figure 10:
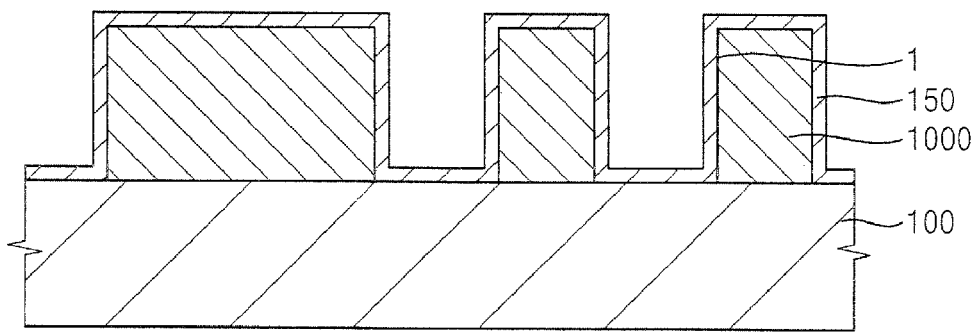

Referring to FIG. 10, a liner 150 is formed on the first insulating layer 100 and the conductive pattern 1000 so that the first opening 1 may be partially filled with the liner 150. The liner 150 may be formed using an insulating material such as silicon oxide. The liner 150 may be formed by a CVD process.

Figure 11:
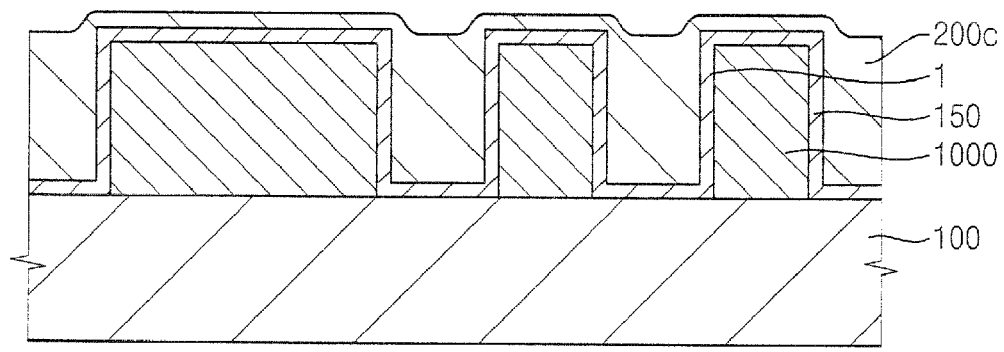

Referring to FIG. 11, a preliminary spin-on layer 200c is formed on the liner 150 so that the first opening 1 partially filled with the liner 150 may be filled with the preliminary spin-on layer 200c. The preliminary spin-on layer 200c may include a low-k material and solvent.

The low-k material may include silicon. For example, the low-k material may be hydrogen silsesquioxane, methyl silsesquioxane, or methyl hydrogen silsesquioxane. These low-k materials may be used alone or in a mixture thereof.

Particularly, hydrogen silsesquioxane includes silicon combined with hydrogen. Methyl silsesquioxane includes silicon combined with a methyl group. Ethyl hydrogen silsesquioxane includes silicon combined with hydrogen and silicon combined with a methyl group.

The solvent may be propylene glycol dimethyl ether. Because the preliminary spin-on layer 200c includes the solvent, the preliminary spin-on layer 200c may have fluidity.

Figure 12:
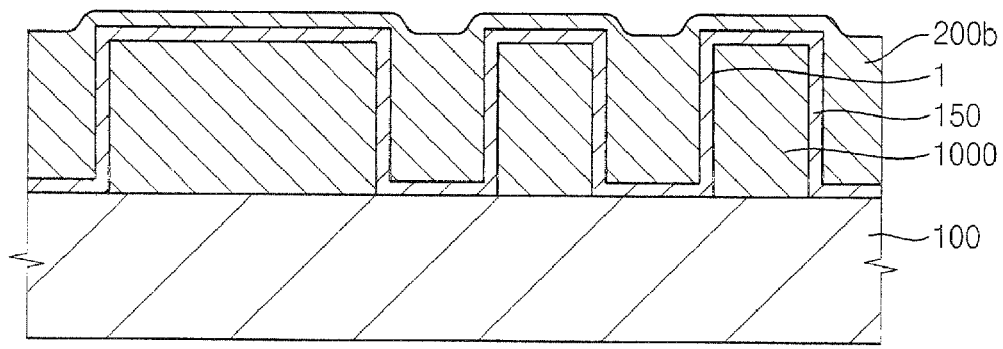

Referring to FIG. 12, a preliminary thermal treatment including a preliminary first thermal treatment, a preliminary second thermal treatment, and a preliminary third thermal treatment may be performed on the preliminary spin-on layer 200c so that a spin-on layer 200b may be formed.

The preliminary first thermal treatment may be performed at a temperature of about 70° C. to about 90° C. for about 1 minute to about 3 minutes in a nitrogen atmosphere. For example, the preliminary first thermal treatment may be performed at a temperature of about 80° C. for about 2 minutes in a nitrogen atmosphere. The solvent in the preliminary spin-on layer 200c may be removed by the preliminary first thermal treatment so that the spin-on layer 200b may be relatively solid.

The preliminary second thermal treatment is performed after the preliminary first thermal treatment is performed. The preliminary second thermal treatment may be performed at a temperature of about 90° C. to about 260° C. for about 1 minute to about 3 minutes in a nitrogen atmosphere. For example, the preliminary second thermal treatment may be performed at a temperature of about 150° C. for about 2 minutes in the nitrogen atmosphere. A surface flatness of the spin-on layer 200b may be improved by the preliminary second thermal treatment.

The preliminary third thermal treatment is performed after the preliminary second thermal treatment. The preliminary third thermal treatment may be performed at a temperature of about 260° C. to about 370° C. for about 1 minute to about 3 minutes in a nitrogen atmosphere. For example, the preliminary third thermal treatment may be performed at a temperature of about 350° C. for about 2 minutes in the nitrogen atmosphere. The spin-on layer 200b may become denser by virtue of the preliminary third thermal treatment.

Figure 13:
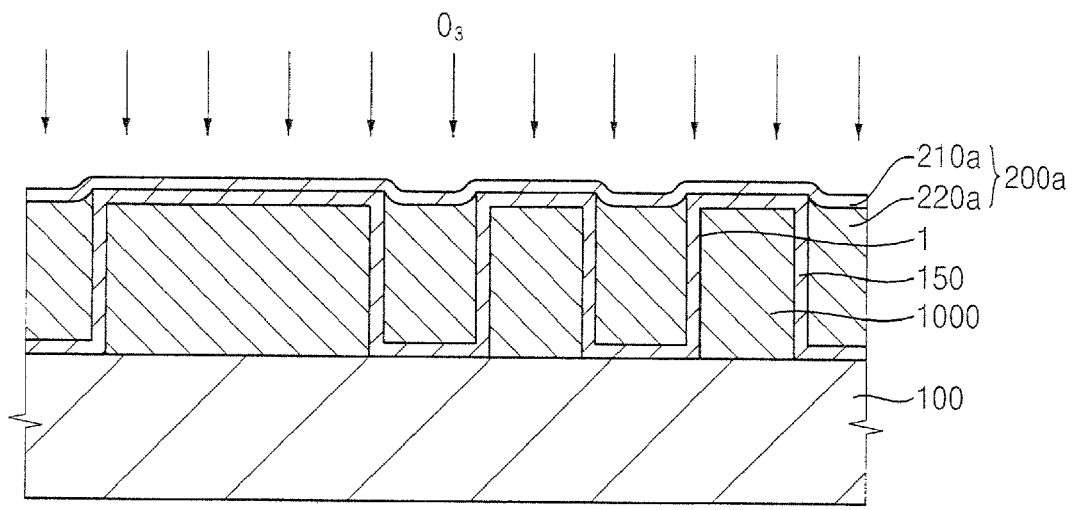

Referring to FIG. 13, an upper portion of the spin-on layer 200b is provided with an ozone gas so that a preliminary second insulating layer 200a including a preliminary upper insulating film 210a and a preliminary lower insulating film 220a may be formed.

Reactivity of an oxygen ($O_2$) gas having relatively high temperature or an oxygen plasma may be greater than that of the ozone gas. Thus, if the upper portion of the spin-on layer 200b is provided with the oxygen gas or the oxygen plasma instead of the ozone gas to form the preliminary upper insulating film 210a, the preliminary upper insulating film 210a may become relatively thick in a relatively short time. Thus, it may be hard to control the thickness of the preliminary upper insulating film 210a. Therefore, the thickness of the preliminary upper insulating film 11a may be more efficiently controlled by providing the spin-on layer 200b with the ozone gas to form the preliminary upper insulating film 210a.

When the upper portion of the spin-on layer 200b is provided with the ozone gas, a hydroxyl group (—OH) may substitute for a hydrogen and/or methyl group to be combined with silicon in the low-k material to generate byproducts.

Thereafter, the hydroxyl groups combined with silicon may generate silicon oxide and moisture in a process of dehydration/condensation reactions. Thus, the preliminary upper insulating film 210a may include byproducts, silicon oxide, and moisture. Here, as the preliminary upper insulating film 210a becomes thick, the amount of byproducts and moisture in the preliminary upper insulating film 210a may increase. On the other hand, the preliminary lower insulating film 220a may include the low-k material.

When an ozone density of the ozone gas is lower than about 100 g/Nm$^3$, the hydroxyl group may not efficiently substitute for the hydrogen and/or methyl group to be combined with silicon included in the low-k material. On the other hand, when the ozone density of the ozone gas is higher than about 350 g/Nm$^3$, the preliminary upper insulating film 210a is relatively thick. In addition, the preliminary upper insulating film 210a may include a relatively large amount of the byproducts and the moisture. Thus, the byproducts and the moisture may not be clearly removed even by a main thermal treatment subsequently performed on the preliminary insulating layer 210a. Thus, the ozone density of the ozone gas may preferably be about 100 g/Nm$^3$ to about 350 g/Nm$^3$.

When the preliminary second insulating layer 200a is formed at a temperature lower than about 50° C., the ozone gas may have a relatively small amount of energy. Thus, it is disadvantageous in that the hydroxyl group may not efficiently substitute for the hydrogen and/or methyl group to be combined with silicon included in the low-k material. On the other hand, in instances where the preliminary second insulating layer 200a is formed at a temperature higher than about 450° C., the preliminary upper insulating film 210a may be relatively thick. In addition, the preliminary upper insulating film 210a may include a relatively large amount of the byproducts and moisture. Thus, the byproducts and the moisture may not be clearly removed even though the main thermal treatment is subsequently performed on the preliminary second insulating layer 200a. Thus, the preliminary insulating layer 200a may preferably be formed at a temperature of about 50° C. to about 450° C.

In instances where the time during which the preliminary second insulating layer 200a is formed is shorter than about 5 seconds, the hydroxyl group may not efficiently substitute for the hydrogen and/or methyl group to be combined with silicon included in the low-k material. On the other hand, if the time during which the preliminary second insulating layer 200a is formed is longer than about 600 seconds, the preliminary upper insulating film 210a may be relatively thick. In addition, the preliminary upper insulating film 210a may include a relatively large amount of the byproducts and moisture. Thus, the byproducts and the moisture may not be clearly removed even though the main thermal treatment is subsequently performed on the preliminary second insulating layer 200a. Thus, the preliminary second insulating layer 200a may preferably be formed for about 5 seconds to about 600 seconds.

Here, the preliminary upper insulating film 210a and the preliminary lower insulating film 220a include silicon oxide and low-k material, respectively. Thus, the dielectric constant of the preliminary lower insulating film 220a may be smaller than that of the upper insulating film 210a.

In addition, the preliminary upper insulating film 210a may be formed by the dehydration/condensation reactions. Thus, the preliminary upper insulating film 210a may be denser than the preliminary lower insulating film 220a.

Figure 14:
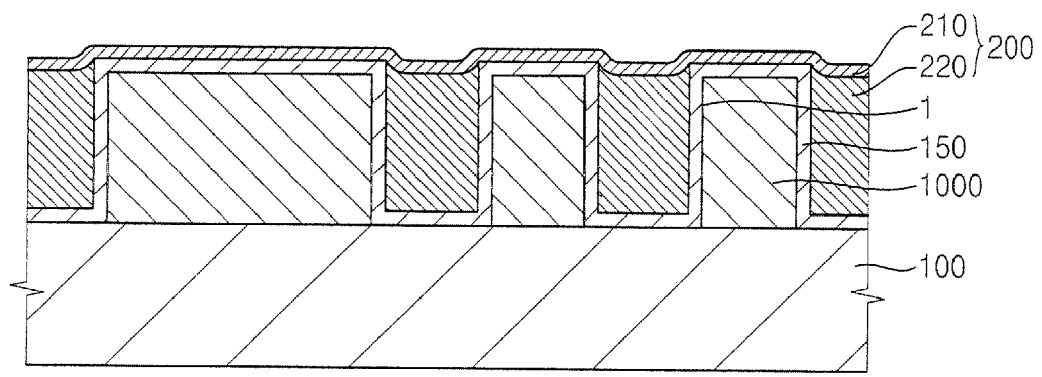

Referring to FIG. 14, the main thermal treatment is performed on the preliminary second insulating layer 200a so that a second insulating layer 200 including an upper insulating film 210 and a lower insulating film 220 may be formed. The main thermal treatment is performed to remove the byproducts and moisture from the preliminary upper insulating film 210a. The main thermal treatment may be performed in a nitrogen atmosphere. Because the byproducts and the moisture in the preliminary upper insulating film 210a are removed by the main thermal treatment, the preliminary upper insulating film 210a may be denser than the upper insulating film 210.

In addition, the byproducts and the moisture diffused into the preliminary lower insulating film 220a by the preliminary thermal treatment may be removed by the main thermal treatment. Thus, the lower insulating film 220 may be denser than the preliminary lower insulating film 220a.

The preliminary thermal treatment may be performed using an inactive gas such as a nitrogen gas. Alternatively, the main thermal treatment may be performed using an inert gas such as an argon gas.

If the main thermal treatment is performed at a temperature lower than about 370° C., the byproducts and the moisture may not be clearly removed from the preliminary upper insulating film 201a. On the other hand, if the main thermal treatment is performed at a temperature higher than about 440° C., the conductive pattern 1000 may be melted. Thus, the main thermal treatment may preferably be performed at a temperature of about 370° C. to about 440° C.

If the main thermal treatment is performed for less than about 27 minutes, the byproducts and the moisture may not be clearly removed from the preliminary upper insulating film 210a. On the other hand, if the main thermal treatment is performed for more than about 33 minutes, the conductive pattern 1000 may be damaged. Thus, the main thermal treatment may preferably be performed for about 27 minutes to about 33 minutes.

Figure 15:
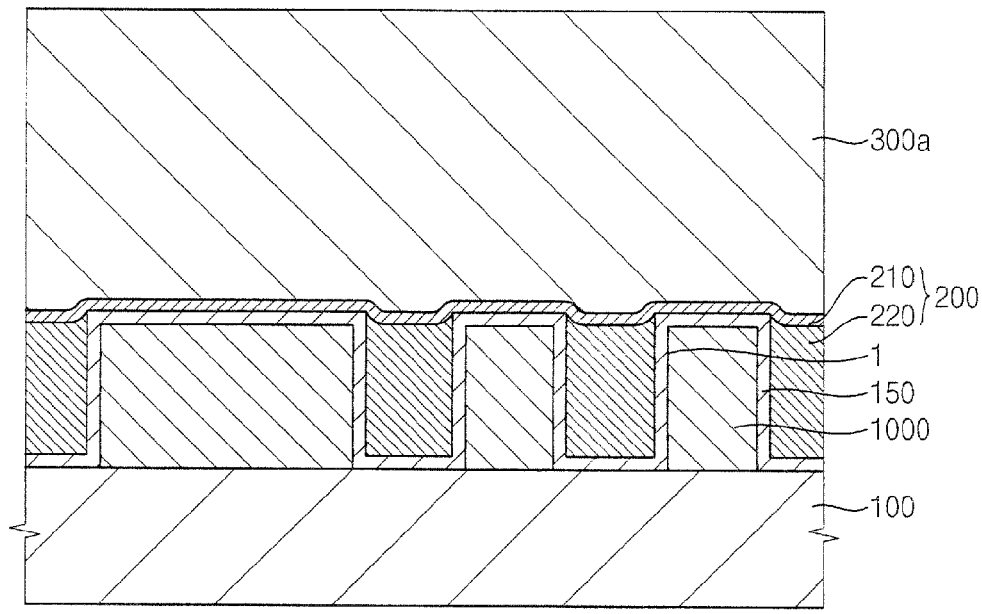

Referring to FIG. 15, a preliminary third insulating layer 300a is formed on the second insulating layer 200. The preliminary third insulating layer 300a is formed using an insulating material such as silicon oxide. The preliminary third insulating layer 300a may be formed by a CVD process.

Figure 16:
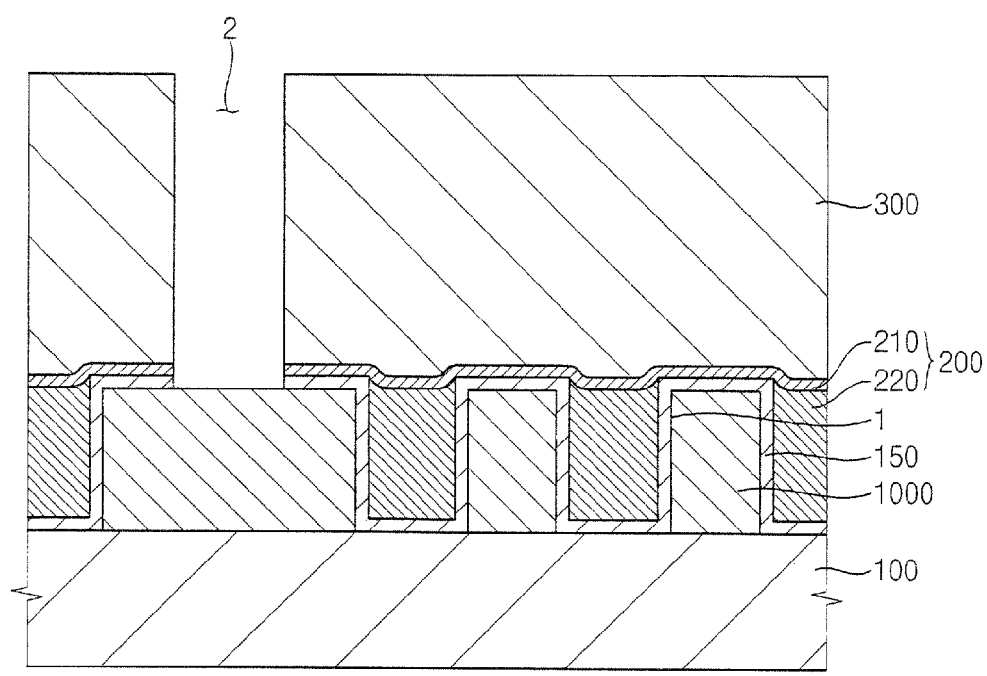

Referring to FIG. 16, the preliminary third insulating layer 300a, the upper insulating film 210, and the liner 150 may be partially etched so that a third insulating layer 300 having a second opening 2 exposing the conductive pattern 1000 may be formed.

Although not illustrated in FIG. 16, a portion of the conductive pattern 1000 may be intentionally etched while the preliminary third insulating layer 300a, the upper insulating film 210, and the liner 150 are partially etched. Thus, the depth of the second opening 2 may increase.

Figure 17:
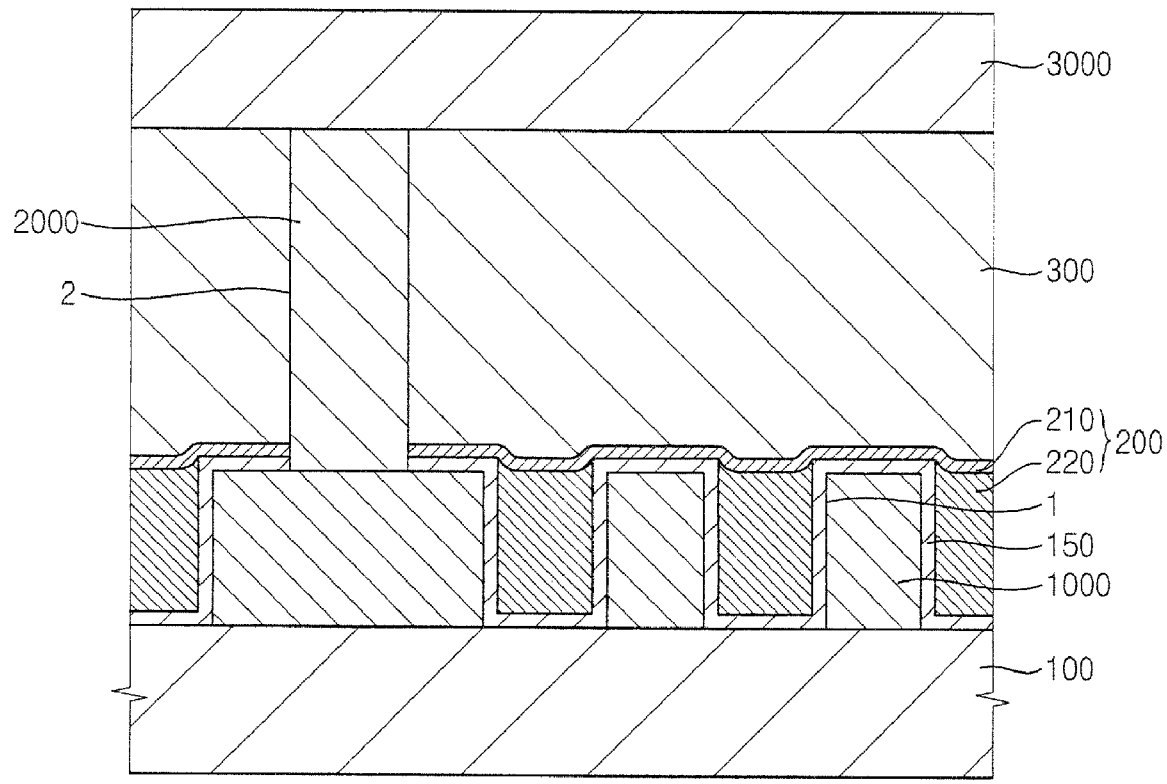

Referring to FIG. 17, a conductive plug 2000 filling the second opening 2 is formed using a conductive material such as a metal. The metal may be aluminum, tungsten, titanium, or copper.

Thereafter, a conductive layer 3000 is formed on the conductive plug 2000 and the third insulating layer 300. The conductive layer 3000 may be formed using a conductive material such as a metal. The conductive layer 3000 may be formed by a PVD process. The metal may be aluminum, tungsten, titanium, or copper. Thus, a semiconductor device 10000 may be manufactured.

FIGS. 18 to 26 are cross-sectional views illustrating methods of manufacturing semiconductor device in accordance with another embodiment of the present invention.

The methods illustrated in FIGS. 18 to 26 are substantially the same as those already illustrated in FIGS. 9 to 17 except that a preliminary spin-on layer further includes porogen. Thus, the same reference numerals will be used in FIGS. 18 to 26 to refer to the same parts as those described in FIGS. 9 to 17. In addition, any repetitive explanation will be omitted.

Figure 18:
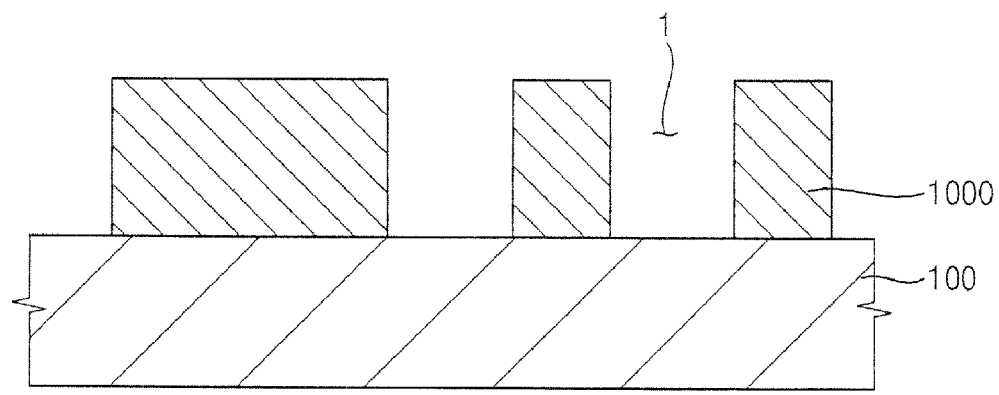
FIGS. 18 to 26 are cross-sectional views illustrating methods of manufacturing a semiconductor device in accordance with another embodiment of the present invention.

Referring to FIG. 18, a conductive pattern 1000 having at least one first opening partially exposing a first insulating layer is formed on the first insulating layer 100.

Figure 19:
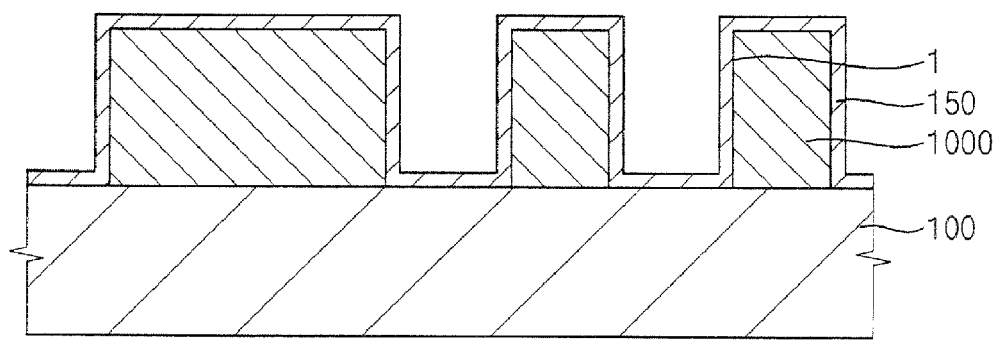

Referring to FIG. 19, a liner 150 is formed on the first insulating layer 100 and the conductive pattern 1000 so that the first opening 1 may be partially filled with the liner 150.

Figure 20:
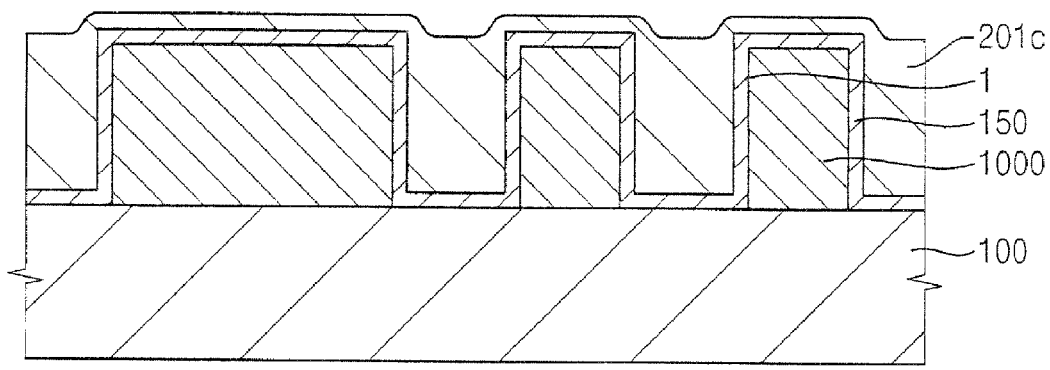

Referring to FIG. 20, a preliminary spin-on layer 201c is formed on the liner 150 so that the first opening partially filled with the liner 150 may be filled with the preliminary spin-on layer 201c. The preliminary spin-on layer 201c may include a low-k material, a solvent, and a porogen. The low-k material includes silicon. The porogen may be polyethylene glycol dimethyl ether.

Figure 21:
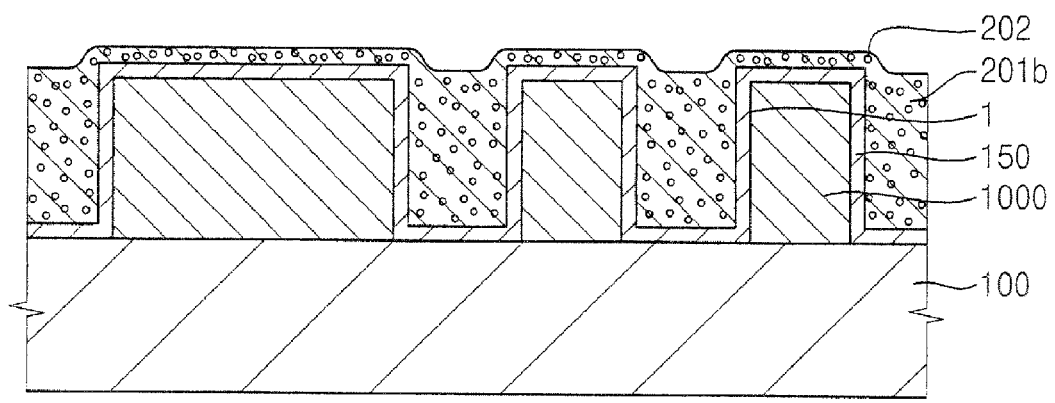

Referring to FIG. 21, a preliminary thermal treatment including a preliminary first thermal treatment, a preliminary second thermal treatment, and a preliminary third thermal treatment may be performed on the preliminary spin-on layer 201c so that a spin-on layer 201b may be formed.

The porogen in the preliminary spin-on layer 201c may be volatized at a relatively high temperature so that a multiplicity of pores 202 may be formed in the spin-on layer 201b. Diameters of the pores 202 may be in the tens of angstroms. The pores 202 may reduce the dielectric constant of the spin-on layer 201b.

Figure 22:
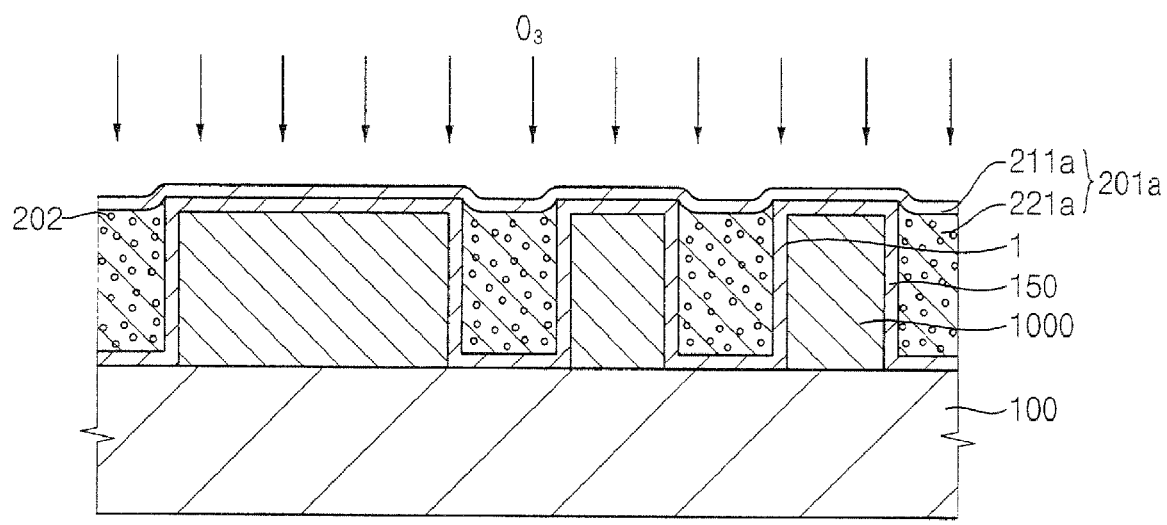

Referring to FIG. 22, an upper portion of the spin-on layer 201b is provided with an ozone gas so that a preliminary second insulating layer 201a including a preliminary upper insulating film 211a and a preliminary lower insulating film 221a may be formed. Here, the pores 202 in the preliminary upper insulating film 211a may be removed.

The preliminary upper insulating film 211a may include byproducts, silicon oxide, and moisture. On the other hand, the preliminary lower insulating film 221a may include a low-k material. In addition, the preliminary lower insulating film 221a may have pores 202.

Figure 23:
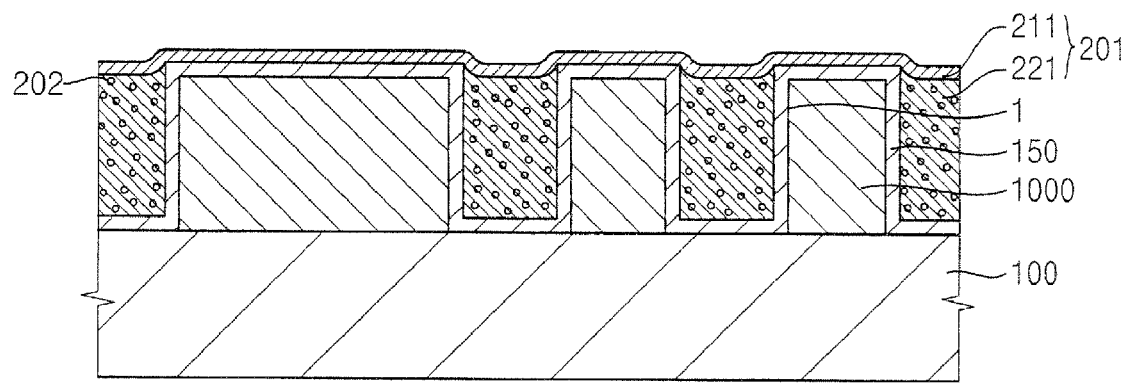

Referring to FIG. 23, a main thermal treatment is performed on the preliminary second insulating layer 201a so that a second insulating layer 201 including an upper insulating film 211 and a lower insulating film 221 may be formed. The main thermal treatment may be performed to remove the byproducts and moisture from the preliminary upper insulating film 211a. In addition, the lower insulating film 211 formed by the main thermal treatment may be denser than the preliminary lower insulating film 221a.

Figure 24:
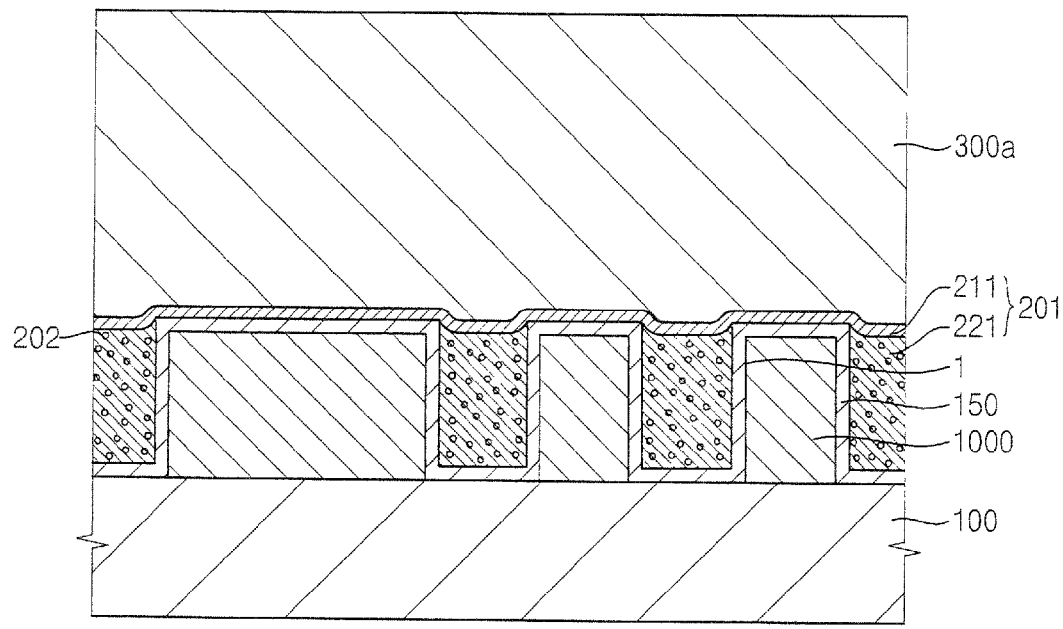

Referring to FIG. 24, a preliminary third insulating layer 300a is formed on the second insulating layer 201.

Figure 25:
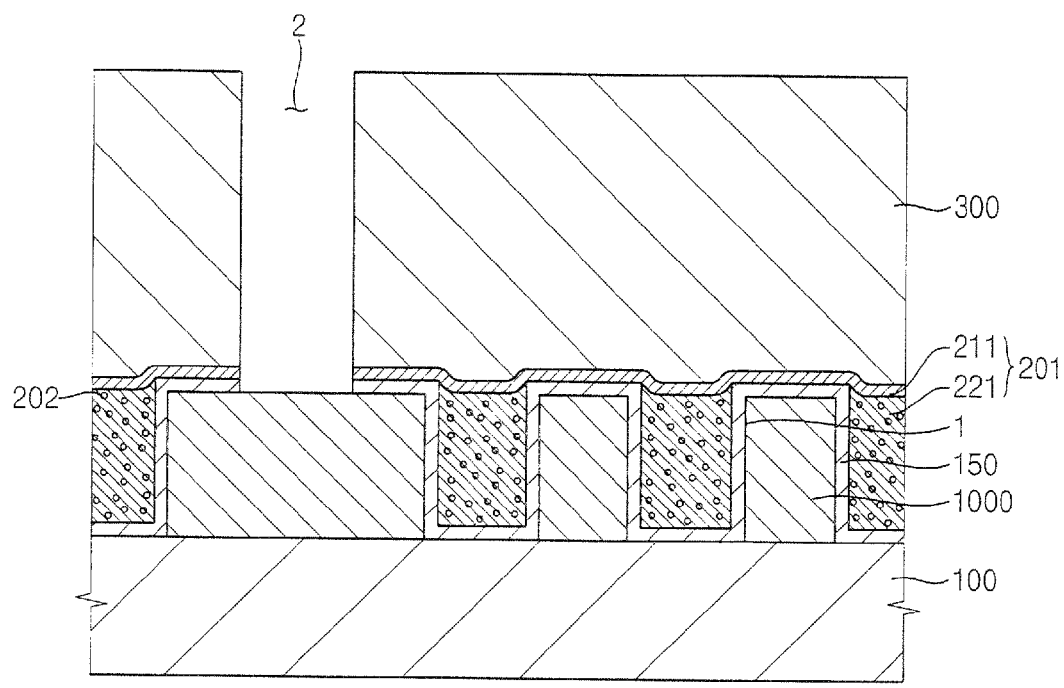

Referring to FIG. 25, the preliminary third insulating layer 300a, the upper insulating film 211, and the liner 150 are partially etched so that a third insulating layer 300 having a second opening 2 exposing the conductive pattern 1000 may be formed.

Figure 26:
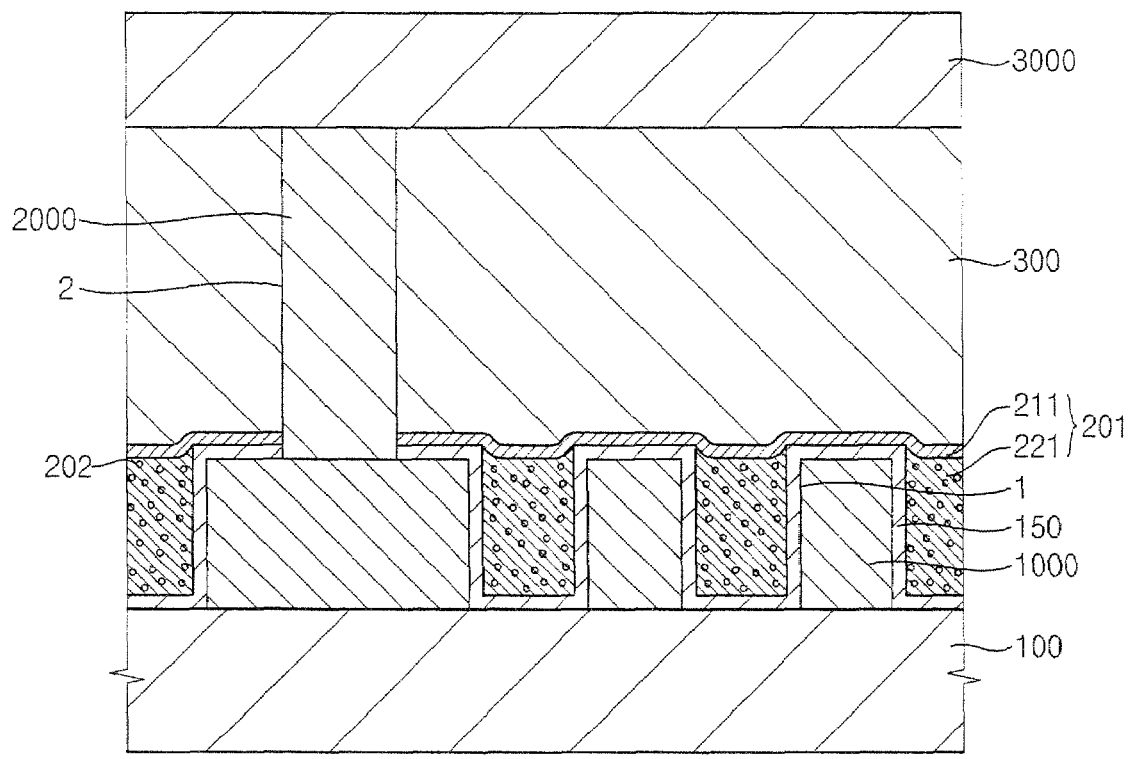

Referring to FIG. 26, a conductive plug 2000 filling up the second opening 2 may be formed. Thereafter, a conductive layer 3000 is formed on the conductive plug 2000 and the third insulating layer 300. Thus, a semiconductor device 20000 may be manufactured.

The following experiments have been performed to evaluate characteristics of an insulating layer formed by methods of some embodiments of the present invention.

Experiment 1

A preliminary spin-on layer including a low-k material, a porogen, and a solvent was formed. The low-k material was methyl hydrogen silsesquioxane. The porogen was polyethylene glycol dimethyl ether. The solvent was propylene glycol dimethyl ether.

A preliminary thermal treatment including a preliminary first thermal treatment, a preliminary second thermal treatment, and a preliminary third thermal treatment was performed on the preliminary spin-on layer to form a spin-on layer. The preliminary first thermal treatment was performed at a temperature of about 80° C. for about 2 minutes in a nitrogen atmosphere. The preliminary second thermal treatment was performed at a temperature of about 150° C. for about 2 minutes in the nitrogen atmosphere. The preliminary third thermal treatment was performed at a temperature of about 350° C. for about 2 minutes in the nitrogen atmosphere.

An upper portion of the spin-on layer was provided with an ozone gas so that a preliminary insulating layer including a preliminary upper insulating film and a preliminary lower insulating film was formed. The preliminary insulating layer was formed at a temperature of about 300° C. A time required for forming the preliminary insulating layer was about 5 seconds.

Thereafter, a main thermal treatment was performed on the preliminary insulating layer so that a first insulating layer including an upper insulating film and a lower insulating film was formed. The main thermal treatment was performed at a temperature of about 400° C. for about 30 minutes in a nitrogen gas atmosphere.

Experiment 2

A second insulating layer of Experiment 2 was manufactured by operations substantially the same as those already illustrated in Experiment 1 except for a time required for forming the preliminary insulating layer. The time required for forming the preliminary insulating layer was about 60 seconds in Experiment 2.

Experiment 3

A third insulating layer of Experiment 3 was manufactured by operations substantially the same as those already illustrated in Experiment 1 except for a time required for a time for forming the preliminary insulating layer. The time required for forming the preliminary insulating layer was about 120 seconds in Experiment 3.

Experiment 4

A fourth insulating layer of Experiment 4 was manufactured by operations substantially the same as those already illustrated in Experiment 1 except a time required for a time for forming the preliminary insulating layer. The time required for forming the preliminary insulating layer was about 180 seconds in Experiment 4.

Figure 27:
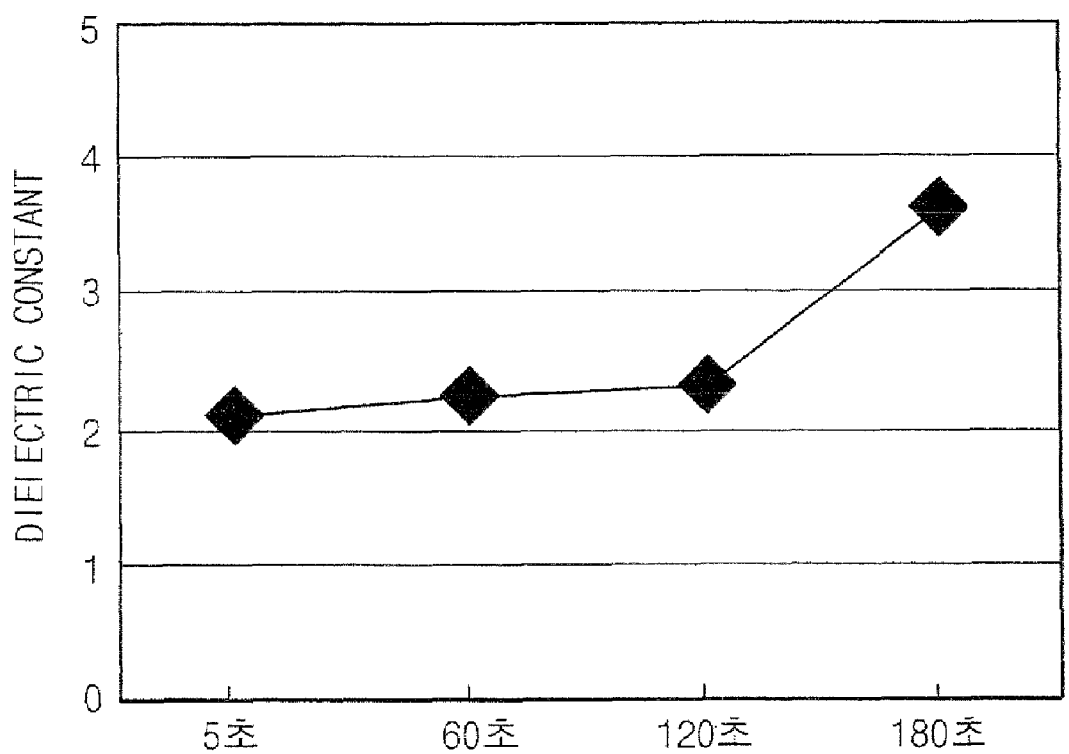
FIG. 27 is a graph illustrating dielectric constants of first to fourth insulating layers obtained by Experiment 1 to 4, respectively.

FIG. 27 is a graph illustrating the dielectric constants of the above first to fourth insulating layers.

Referring to FIG. 27, an average of the dielectric constants of the first and fourth insulating layers is relatively low. That is, the average is about 2.7. Thus, if a space between conductors is filled with any of the insulating layers resulting from Experiment 1 through Experiment 4, a parasite capacitance may be efficiently prevented.

In addition, the increase rate of the dielectric constant may be relatively low even when the time required for forming the preliminary insulating layer is less than about 120 seconds. However, if the time is above 120 seconds, the increase rate of the dielectric constant may be substantially larger.

Figure 28:
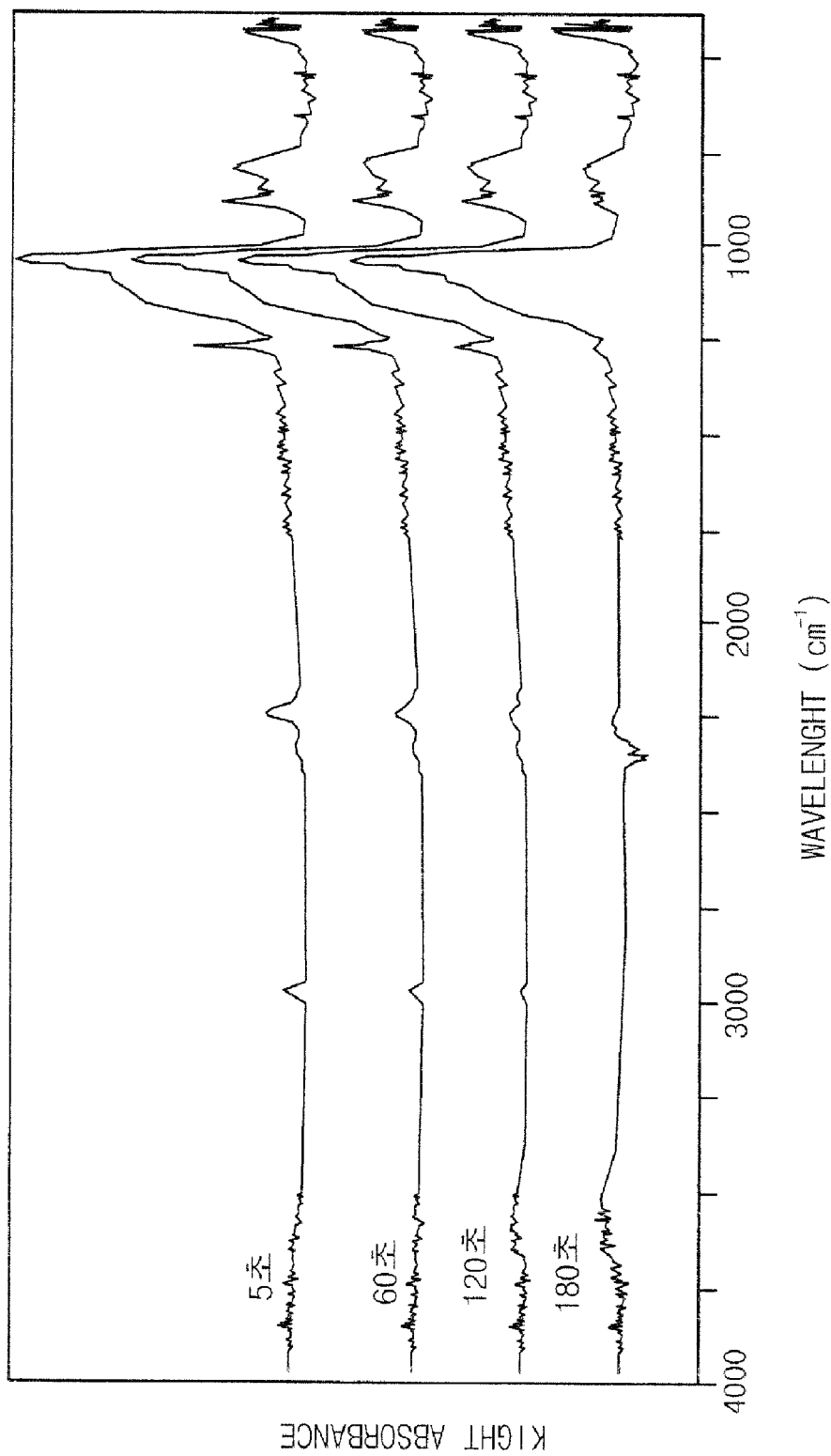
FIG. 28 is a graph showing light absorbance measured when the first to fourth insulating layers of Experiment 1 to 4 are provided with light.

FIG. 28 is a graph showing light absorbance measured when the first to fourth insulating layers are provided with light.

In general, moisture absorbs light having a wavelength of about 3,250 $Cm^{-1}$ to about 3,750 $Cm^{-1}$. A "C—H" bond absorbs light having a wavelength of about 3,000 $Cm^{-1}$. A "Si—H" bond absorbs light having a wavelength of about 2,250 $Cm^{-1}$. A "Si—CH3" bond absorbs light having a wavelength of about 1,250 $Cm^{-1}$.

Referring to FIG. 28, as the time required for forming the preliminary insulating layer increases from 5 seconds to 180 seconds, amounts of the "C—H" bond, the "Si—H" bond, and the "Si—$CH_3$" bond may decrease. On the other hand, the amounts of the moisture may increase.

As a result, the preliminary upper insulating film may include silicon oxide. In addition, if the preliminary upper insulating film becomes thick, the removal of the moisture through the preliminary upper insulating film may become difficult. Thus, the moisture may reside in the preliminary upper insulating film.

According to the present invention, when an insulating layer including an upper portion of oxide and a lower portion of a low-k material is formed, a thickness of the upper portion may be efficiently controlled.

The foregoing is illustrative of the present invention and is not to be construed as limiting thereof. Although a few embodiments of this invention have been described, those skilled in the art will readily appreciate that many modifications are possible in the embodiments without materially departing from the novel teachings and advantages of this invention. Accordingly, all such modifications are intended to be included within the scope of this invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

What is claimed is:

1. A method of forming an insulating layer, the method comprising:
    forming a preliminary insulating layer including a material having a relatively low dielectric constant on an object; and
    providing an upper portion of the preliminary insulating layer with an ozone gas under a dry atmosphere to transform the preliminary insulating layer into an insulating layer comprising an upper insulating film including an oxide and a lower insulating film including the material having the relatively low dielectric constant,
    wherein the upper insulating film is located on the lower insulating film, and
    the forming of the preliminary insulating layer includes coating the object with a fluid including the material having the relatively low dielectric constant and a solvent, and performing a thermal treatment on the fluid at a temperature of about 70° C. to about 370° C.

2. The method of claim 1, wherein the material having the relatively low dielectric constant includes silicon and the oxide includes silicon oxide.

3. The method of claim 2, wherein the material having the relatively low dielectric constant includes at least one selected from the group consisting of hydrogen silsesquioxane, methyl silsesquioxane, and ethyl hydrogen silsesquioxane.

4. The method of claim 1, wherein the upper insulating film is denser than the lower insulating film.

5. The method of claim 1, wherein the fluid further includes a porogen.

6. The method of claim 1, wherein the ozone gas has an ozone density of about 100 $g/Nm^3$ to about 350 $g/Nm^3$.

7. The method of claim 1, wherein the insulating layer is formed at a temperature of about 50° C. to about 450° C.

8. The method of claim 1, wherein the insulating layer is formed for about 5 seconds to about 600 seconds.

9. The method of claim 1, further comprising performing a thermal treatment on the insulating layer at a temperature of about 370° C. to about 440° C.

10. The method of claim 9, wherein the thermal treatment is performed for about 27 minutes to about 33 minutes.

11. The method of claim 1, wherein a dielectric constant of the lower insulating film is smaller than that of the upper insulating film.

12. A method of manufacturing a semiconductor device, the method comprising:
   forming a conductive pattern on a first insulating layer, the conductive pattern having an opening partially exposing the first insulating layer;
   forming a preliminary second insulating layer on the first insulating layer and the conductive pattern, the preliminary second insulating layer filling up the opening, the preliminary second insulating layer including a material having a relatively low dielectric constant;
   providing an upper portion of the preliminary second insulating layer with an ozone gas under a dry atmosphere to transform the preliminary second insulating layer into a second insulating layer comprising an upper insulating film including an oxide and a lower insulating film including the material having the relatively low dielectric constant, the upper insulating film covering an upper face of the conductive pattern, the lower insulating film formed under the upper insulating film;
   forming a third insulating layer on the upper insulating film;
   forming a conductive plug through the third insulating layer and the upper insulating film to be electrically connected to the conductive pattern; and
   forming a conductive layer on the conductive plug and the third insulating layer,
   wherein the forming of the preliminary second insulating layer includes coating the object with a fluid including the material having the relatively low dielectric constant and a solvent, and performing a thermal treatment on the fluid at a temperature of about 70° C. to about 370° C.

13. The method of claim 12, further comprising forming a liner on the conductive pattern and first insulating layer exposed by the conductive pattern opening before forming the preliminary second insulating layer.

14. The method of claim 12, wherein the fluid further includes a porogen.

15. The method of claim 12, further comprising performing a thermal treatment on the second insulating layer at a temperature of about 370° C. to about 440° C. before the forming of the third insulating layer.

16. The method of claim 12, wherein the material having the relatively low dielectric constant includes silicon and the oxide includes silicon oxide.

17. A method of forming an insulating layer, the method comprising:
   forming a preliminary spin-on layer on an object, the preliminary spin-on layer including a material having a relatively low dielectric constant and a porogen;
   performing a first thermal treatment on the preliminary spin-on layer to form a spin-on layer including a plurality of pores;
   performing an ozone treatment on the spin-on layer to form a preliminary insulating layer comprising a preliminary upper insulating film including an oxide and a preliminary lower insulating film including the material having the relatively low dielectric constant, wherein the pores in the preliminary upper insulating film are removed; and
   performing a second thermal treatment on the preliminary insulating layer to form an insulating layer comprising an upper insulting film and a lower insulating film, wherein the second thermal treatment removes byproducts and moisture from the upper preliminary insulating layer.

18. The method of claim 17, wherein the porogen is polyethylene glycol dimethyl ether.

* * * * *